United States Patent
Wouters et al.

(10) Patent No.: US 7,186,572 B2
(45) Date of Patent: Mar. 6, 2007

(54) SIMPLIFIED BOTTOM ELECTRODE-BARRIER STRUCTURE FOR MAKING A FERROELECTRIC CAPACITOR STACKED ON A CONTACT PLUG

(75) Inventors: Dirk Wouters, Heverlee (BE); Jean-Luc Everaert, Gooik (BE); Judit Lisoni, Heverlee (BE)

(73) Assignees: Interuniversitair Microelektronica Centrum (IMEC), Leuven (BE); ST Microelectronics, Rousset (FR)

( * ) Notice: Subject to any disclaimer, the term of this patent is extended or adjusted under 35 U.S.C. 154(b) by 0 days.

(21) Appl. No.: 11/046,057

(22) Filed: Jan. 28, 2005

(65) Prior Publication Data

US 2005/0186727 A1    Aug. 25, 2005

Related U.S. Application Data

(62) Division of application No. 10/292,363, filed on Nov. 8, 2002, now Pat. No. 6,885,570.

(60) Provisional application No. 60/337,525, filed on Nov. 9, 2001.

(51) Int. Cl.
H01L 21/00 (2006.01)
H01L 21/02 (2006.01)

(52) U.S. Cl. .......................... 438/3; 438/396

(58) Field of Classification Search ............ 438/3, 438/396
See application file for complete search history.

(56) References Cited

U.S. PATENT DOCUMENTS

| 4,983,570 | A | * | 1/1991 | Creuzet et al. ............. 505/447 |
| 5,824,590 | A | * | 10/1998 | New ........................... 438/393 |
| 5,841,160 | A | | 11/1998 | Nakamura |
| 5,973,342 | A | | 10/1999 | Nakamura |
| 6,072,207 | A | | 6/2000 | Yoshimor et al. |
| 6,141,242 | A | | 10/2000 | Hsu et al. |
| 6,150,184 | A | | 11/2000 | Evans et al. |
| 6,236,113 | B1 | | 5/2001 | Zhang et al. |

(Continued)

FOREIGN PATENT DOCUMENTS

DE    198 60 080 A1    7/2000

(Continued)

OTHER PUBLICATIONS

D. Jung et al., Technical Digest IEDM (International Electronic Devices Meeting), San Francisco, CA, Dec. 10-13, 2000, pp. 800-801, paper 34.4.1.

(Continued)

Primary Examiner—Zandra V. Smith
Assistant Examiner—Pamela E. Perkins
(74) Attorney, Agent, or Firm—Knobbe Martens Olson & Bear LLP

(57) ABSTRACT

The present invention is related to the realization of a simplified bottom electrode stack for ferroelectric memory cells. More particularly, the invention is related to ferroelectric memory cells wherein the ferroelectric capacitor is positioned directly on top of a contact plug. The bottom electrode stack is prepared by depositing a ferroelectric film atop an Ir or Ru metal electrode layer, then annealing the ferroelectric layer in an oxygen ambient wherein the partial pressure of oxygen is controlled at a level sufficient to oxidize the ferroelectric layer but not at a level sufficient to oxidize the metal electrode layer.

16 Claims, 4 Drawing Sheets

U.S. PATENT DOCUMENTS

| | | | |
|---|---|---|---|
| 6,376,328 B1 * | 4/2002 | Aiso et al. | 438/398 |
| 6,462,931 B1 * | 10/2002 | Tang et al. | 361/305 |
| 2001/0013637 A1 | 8/2001 | Zhang et al. | |
| 2002/0070404 A1 | 6/2002 | Bruchhaus et al. | |

FOREIGN PATENT DOCUMENTS

| EP | 1 006 581 | 6/2000 |
|---|---|---|

OTHER PUBLICATIONS

S. Yong Cha and H. Chul Lee, *Jpn. J. Appl. Phys.*, vol. 38 (1999), p. 1128.

Ito, *Jpn. J. Appl. Phys.*, vol. 35 (1996), pp. 4925-4929.

Ogata et al., *Extended Abstracts of the 1997 International Conference on Solid State Devices and Materials*, Hamamatsu, 1997, p. 40-41.

Fujimori et al., "Low Temperature Crystallization of Sol-gel Derived $Pb(Zr, Ti)O_3$ Thin Films", *Jpn. J. Appl. Phys.*, vol. 38, 1999, pp. 5346-5349.

MRS Fall Meeting Nov. 29-Dec. 3, 1999, Boston, MA, Abstract Y7.3, Fujimon et al., "Low Oxygen Pressure Crystallization of $Pb(Zr,Ti)O_3$ for Embedded Ferams".

* cited by examiner

US 7,186,572 B2

SIMPLIFIED BOTTOM ELECTRODE-BARRIER STRUCTURE FOR MAKING A FERROELECTRIC CAPACITOR STACKED ON A CONTACT PLUG

RELATED APPLICATION

This application is a divisional of U.S. Ser. No. 10/292,363, filed Nov. 8, 2002 now U.S. Pat. No. 6,885,570, which claims priority under 35 U.S.C. § 119(e) to U.S. provisional application Ser. No. 60/337,525, filed Nov. 9, 2001.

FIELD OF THE INVENTION

The present invention is related to the realization of a simplified bottom electrode stack for high-density ferroelectric memory cells, where the ferroelectric capacitor is positioned directly on top of the contact plug.

BACKGROUND OF THE INVENTION

FRAM (Ferroelectric RAM) is random access memory that combines the fast read and write access of dynamic RAM (DRAM)—the most common kind of personal computer memory—with the ability to retain data when power is turned off (as do other non-volatile memory devices such as ROM and flash memory). Because FRAM is not as dense (i.e., cannot store as much data in the same space) as DRAM and SRAM, it is not likely to replace these technologies. However, because it is fast memory with a very low power requirement, it is expected to have many applications in small consumer devices such as personal digital assistants (PDAs), handheld phones, power meters, and smart card, and in security systems. FRAM is faster than flash memory. It is also expected to replace EEPROM and SRAM for some applications and to become a key component in future wireless products.

As depicted in FIG. 2, a ferroelectric memory cell typically comprises a ferroelectric capacitor 9 and a selection transistor 2. The ferroelectric capacitor 9 comprises a stack of a conductive bottom electrode stack 10, a ferroelectric film 11, and a conductive top electrode 12. The ferroelectric memory cell is programmed by applying an electrical signal to the conductive top and bottom electrodes across the ferroelectric film 11. When an electric field is applied to a ferroelectric crystal, the central atom of the ferroelectric compound moves in the direction of the field. Internal circuits sense the charge required to move the atom. When the electric field is removed from the crystal, the central atom stays in position, preserving the state of the memory.

The formation of a crystalline ferroelectric film typically requires high temperature treatment in oxygen ambient. The film can be prepared by different techniques, such as spin-on, physical vapor deposition (PVD), chemical vapor deposition (CVD), and metal organic chemical vapor deposition (MOCVD). MOCVD may be performed in a two-step process, wherein in a first step the ferroelectric film is deposited at lower temperature, and afterwards in a second step the ferroelectric film is crystallized at a higher temperature, e.g. a temperature higher than 400° C. in an oxygen ambient. Alternatively, MOCVD may be performed in a one-step process at a higher temperature in oxygen ambient, wherein deposition and crystallization of the ferroelectric film occur simultaneously.

Examples of ferroelectric materials include, but are not limited to $SrBi_2Ta_2O_9$ (SBT), $Pb(Zr,Ti)O_3$ (PZT) and $(Bi,La)_4Ti_3O_{12}$ (BLT). All ferroelectric layers ultimately incorporate oxygen. This oxygen is a part of the so-called "perovskite" crystal structure, which is typical for ferroelectric films.

Typically, very complex bottom electrode-barrier structures are used to avoid oxygen diffusion to the plug during the processing of the ferroelectric layer, as in a structure identified by layers in the order $Pt/IrO_2/Ir(/TiN)$ wherein TiN is an additional layer which protects the contact plug from interaction with the electrode stack or improves adhesion. See, e.g., D. Jung et al., Technical Digest IEDM (International-Electron Devices Meeting), San Francisco, Calif., Dec. 10–13, 2000, page 00–801, paper 34.4.1. This TiN layer can be part of the contact or can be formed on top of the contact.

The large number of processing steps required to fabricate a complex bottom electrode structure, besides being cost inefficient and environmentally unfriendly, imposes stringent requirements on the fabrication of stacked ferroelectric memory cells.

SUMMARY OF THE INVENTION

A method of fabricating ferroelectric memory cells that avoids the oxidation of a metal electrode layer while forming a crystalline ferroelectric layer on top of it at elevated temperature in oxygen is desirable. Also desirable is a method of fabricating a ferroelectric memory cell wherein a crystalline ferroelectric film is formed on a conductive layer while preserving the conductive properties of this layer, or a method wherein a crystalline ferroelectric film is formed directly on an oxygen diffusion barrier layer. A method of forming a ferroelectric capacitor with a simplified bottom electrode stack is also desirable.

Accordingly, a method for forming a crystalline ferroelectric layer on a metal electrode in oxygen is provided that avoids the oxidation of the underlying metal electrode. The method comprises the crystallization of the ferroelectric layer in an atmosphere having a reduced oxygen partial pressure. In the method, the total pressure in the process chamber is controlled to prevent evaporation of metal or metal oxide compounds from the ferroelectric film as it forms. The oxygen partial pressure ($pO_2$) is kept sufficiently low so as to prevent the oxidation of the metal electrode, yet sufficiently high so as to prevent the reduction of the chemical elements constituting the ferroelectric film at the processing temperature. The oxidation of a metal electrode depends not only on the oxygen partial pressure, but also on the processing temperature and on the reduction potential of the metal electrode. The higher the metal reduction potential is, the higher the minimum temperature at which the metal oxidizes.

The method of preferred embodiments permits the use of a simplified bottom electrode barrier structure for stacked ferroelectric memory cells. In a preferred embodiment, the bottom electrode comprises a single layer, which remains in its metallic form, is conductive, and forms an oxygen diffusion barrier. In a preferred embodiment where Ir is the bottom electrode and $SrBi_2Ta_2O_9$ (SBT) is the ferroelectric layer, simple stacks comprising SBT/Ir/contact plug and SBT/Ir/TiN/contact plug may be formed.

The stacks may be fabricated by forming a bottom electrode layer 10, depositing a ferroelectric layer 11 atop the bottom electrode layer 10, and crystallizing the ferroelectric layer at a temperature (T) in an oxygen ambient, wherein the partial pressure of oxygen in the oxygen ambient is controlled at a level sufficient to oxidize the ferroelectric layer, but not at a level sufficient to oxidize the bottom electrode layer, wherein the bottom electrode layer is conductive and forms a barrier to oxygen diffusion. The process temperature typically ranges from 600° C. to 800° C., and preferably from 650° C. to 750° C. The partial oxygen pressure range log(pO$_2$) is typically from about −3.5 to about −1.

In a preferred embodiment wherein Ir is the bottom electrode and (Bi,La)$_4$Ti$_3$O$_{12}$ (BLT) is the ferroelectric layer, simple stacks comprising BLT/Ir/contact plug and BLT/Ir/TiN/contact plug may be formed The process temperature typically ranges from 600° C. to 800° C., preferably from 650° C. to 750° C. The partial oxygen pressure range log(pO$_2$) is typically from about −3.5 to about −1.

In a preferred embodiment wherein Ru is the bottom electrode and Pb(Zr,Ti)O$_3$ is the ferroelectric layer, simple stacks comprising PZT/Ru/contact plug and PZT/Ru/TiN/contact plug may be formed. The process temperature typically ranges from 400° C. to 700° C., preferably from 550° C. to 650° C. The partial oxygen pressure range log(pO$_2$) is typically from about −9 to about −12, at a process temperature ranging from 575° C. to 625° C.

In a preferred embodiment, a ferroelectric device is provided, the ferroelectric device comprising at least a conductive top electrode 12, a conductive bottom electrode 10, and in between a ferroelectric layer 11, the conductive bottom electrode 10 comprises a single substantially free of oxygen layer, being in direct contact with the ferroelectric layer 11. The single oxygen-free layer is conductive and forms a barrier to oxygen diffusion.

The ferroelectric layer may comprise Pb(Zr,Ti)O$_3$ (PZT), the bottom electrode may comprise a single non oxidized layer consisting of Ru and can further comprise an adhesion layer comprising TiN. The ferroelectric layer may comprise SrBi$_2$Ta$_2$O$_9$ (SBT), the bottom electrode may comprise a single nonoxidized layer consisting of Ir and can further comprise an adhesion layer comprising TiN. The ferroelectric layer can comprise (Bi,La)$_4$Ti$_3$O$_{12}$ (BLT), the bottom electrode can comprise a single nonoxidized layer consisting of Ir and can further comprise an adhesion layer comprising TiN.

In a first embodiment, a memory cell is provided, the memory cell including: a semiconductor chip, the semiconductor chip including a contact; and a capacitor, the capacitor including: a ferroelectric film, a top electrode, and a bottom electrode, wherein the bottom electrode includes a single nonoxidized, conductive, oxygen diffusion barrier layer in contact with the ferroelectric film and the contact.

In an aspect of the first embodiment, the memory cell further includes a transistor, the transistor including a source junction, a drain junction, a gate, and a channel region In an aspect of the first embodiment, the single nonoxidized, conductive, oxygen diffusion barrier layer includes ruthenium.

In an aspect of the first embodiment, the single nonoxidized, conductive, oxygen diffusion barrier layer includes iridium.

In an aspect of the first embodiment, the ferroelectric layer includes SrBi$_2$Ta$_2$O$_9$, Pb(Zr,Ti)O$_3$, and (Bi,La)$_4$Ti$_3$O$_{12}$.

In an aspect of the first embodiment, the contact includes tungsten or polysilicon.

In an aspect of the first embodiment, the memory cell further includes an adhesion layer in contact with the single nonoxidized, conductive, oxygen diffusion barrier layer and the contact.

In an aspect of the first embodiment, the adhesion layer includes a nitride such as Ti nitride, Ta nitride, Al nitride, alloys thereof, or mixtures thereof.

In an aspect of the first embodiment, the contact includes a stack, the stack including titanium nitride on a material such as tungsten or aluminum.

In a second embodiment, a capacitor is provided, the capacitor including: a ferroelectric film; a first electrode; and a second electrode, the second electrode consisting of a nonoxidized conductive, oxygen diffusion barrier layer.

In an aspect of the second embodiment, the nonoxidized conductive, oxygen diffusion barrier layer includes a single layer, wherein the single layer is in contact with the ferroelectric film.

In an aspect of the second embodiment, the memory cell further includes an adhesion layer in contact with the single nonoxidized, conductive, oxygen diffusion barrier layer In an aspect of the second embodiment, the adhesion layer includes a nitride such as Ti nitride, Ta nitride, Al nitride, alloys thereof, or mixtures thereof.

In a third embodiment, a capacitor is provided, the capacitor including: a ferroelectric film; a first electrode; and a second electrode, the second electrode including a nonoxidized conductive, oxygen diffusion barrier layer in contact with the ferroelectric film.

In an aspect of the third embodiment, the memory cell further includes an adhesion layer in contact with the single nonoxidized, conductive, oxygen diffusion barrier layer In an aspect of the third embodiment, the adhesion layer includes a nitride such as Ti nitride, Ta nitride, Al nitride, alloys thereof, or mixtures thereof.

In a fourth embodiment, a method of fabricating a capacitor is provided, the capacitor including a ferroelectric film in contact with a conductive, oxygen diffusion barrier electrode layer, the method including the steps of: forming a conductive, oxygen diffusion barrier electrode layer; depositing a ferroelectric layer atop the conductive, oxygen diffusion barrier electrode layer; and annealing the ferroelectric layer in an oxygen ambient, wherein a partial pressure of oxygen in the oxygen ambient pO$_2$ is controlled at a level sufficient to oxidize the ferroelectric layer but not at a level sufficient to oxidize the conductive, oxygen diffusion barrier electrode layer.

In an aspect of the fourth embodiment, the conductive, oxygen diffusion barrier electrode layer includes ruthenium.

In an aspect of the fourth embodiment, the conductive, oxygen diffusion barrier electrode layer includes iridium.

In an aspect of the fourth embodiment, a log(pO$_2$) is greater than a log(pO$_2$-Bulk), wherein pO$_2$-Bulk is a partial pressure of oxygen in a bulk N$_2$ gas containing approximately 0.07 ppm O$_2$.

In an aspect of the fourth embodiment, a log(pO$_2$) is from about −3.5 to about −1.

In an aspect of the fourth embodiment, the annealing is conducted at a temperature of from about 600° C. to about 800° C.

In an aspect of the fourth embodiment, the annealing is conducted at a temperature of from about 650° C. to about 750° C.

In an aspect of the fourth embodiment, the annealing is conducted at a temperature of from about 667° C. to about 717° C.

In an aspect of the fourth embodiment, the conductive, oxygen diffusion barrier electrode layer is iridium, and the annealing is conducted at a temperature of from about 667° C. to about 717° C. and a log (pO$_2$) (torr) of from about −4.5 to about 0 (as depicted by the square box labeled "Process window" in FIG. 4a).

In an aspect of the fourth embodiment, the conductive, oxygen diffusion barrier electrode layer is ruthenium, and the annealing is conducted at a temperature of from about 400° C. to about 600° C. and a log(pO$_2$) (atm) of from about −12.5 to about −9.

DETAILED DESCRIPTION OF THE PREFERRED EMBODIMENT

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

In conventional stacked ferroelectric memory cells, the use of an electrode layer comprising solely, for example, Ir or Ru is typically not feasible, even though these metals are expected to have good oxygen barrier properties. In fact, these metals oxidize in an uncontrolled way during processing of the ferroelectric layer deposited on top of them when conventional conditions of elevated temperature and an oxygen ambient are employed.

Figure 1:
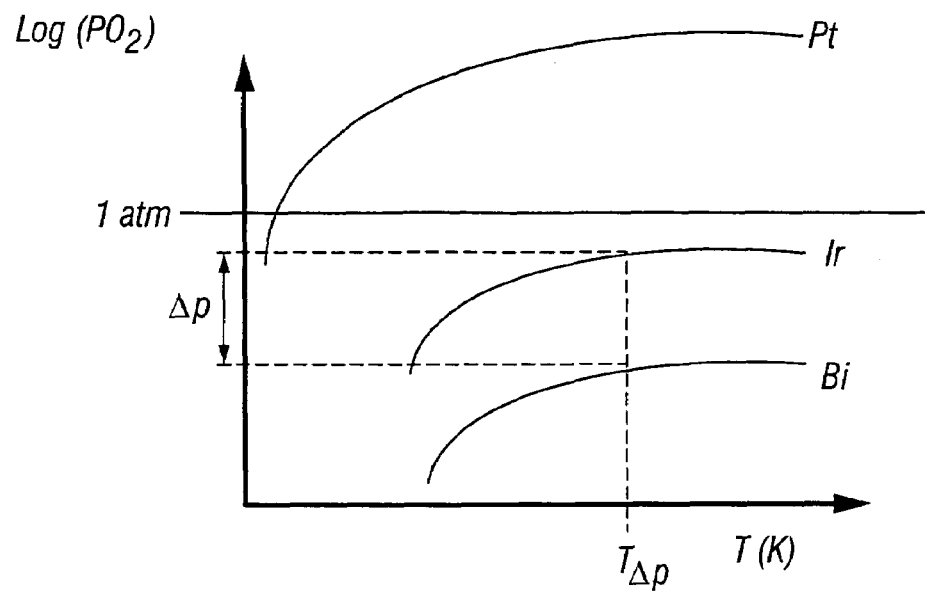
FIG. 1 provides a schematic graph of Log(pO$_2$)-T (i.e., logarithmic of the partial oxygen pressure as function of the absolute temperature) for a ferroelectric layer, an Ir bottom electrode layer, and a Pt bottom electrode layer.

The stability of Ir and Ru under oxidative conditions compared to the stability of Pt is illustrated by the schematic graph of FIG. 1. The y-axis corresponds to log (pO$_2$) (atm) and the x-axis corresponds to temperature (T, in Kelvin). FIG. 1 provides a schematic graph showing the logarithmic of the partial oxygen pressure as function of the absolute temperature for a ferroelectric layer (the curve labeled "Bi"), an Ir bottom electrode layer (the curve labeled "Ir"), and a Pt bottom electrode layer (the curve labeled "Pt"). As is depicted in the graph, Ir is more sensitive to oxidation than Pt, as illustrated by the fact that the stability curve of Ir corresponds to a much lower oxygen partial pressure than the stability curve of Pt. A smaller process window of acceptable partial oxygen pressure conditions ("Δp" in FIG. 1) at a given temperature ("T$_{66}$ p" in FIG. 1) is therefore available for Ir compared to Pt.

Figure 2:
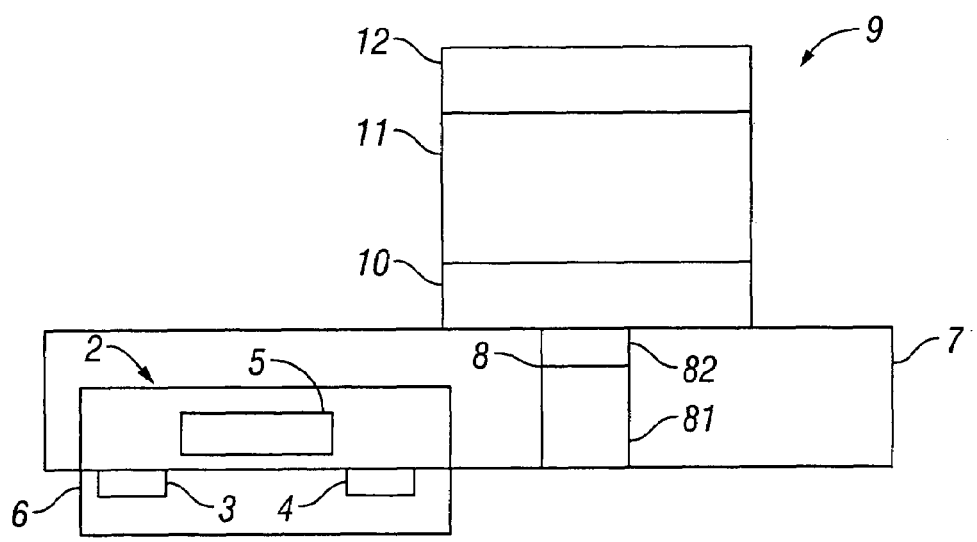
FIG. 2 provides a cross-sectional view of a memory cell showing a semiconductor substrate 1, an insulating layer 7, a contact 8, and a ferroelectric memory cell (or capacitor) 9 including a bottom electrode 10, a ferroelectric layer 11, and a top electrode 12. The memory cell 9 is stacked on a selection transistor 2, including a source junction 3, a drain junction 4, a gate 5, and a channel region 6.

The formation of the ferroelectric film and/or the crystallization of the ferroelectric film take place in a controlled environment, i.e., a process chamber. A method for forming a crystalline ferroelectric layer is provided that avoids the oxidation of the underlying electrode, such that a simplified electrode/barrier structure can be employed. The method involves the crystallization of the ferroelectric layer in a reduced oxygen partial pressure. An advantage of this method is that a bottom electrode 10 (as depicted in FIG. 2) can be formed comprising a non-oxidized layer in contact with the ferroelectric layer 11, while this nonoxidized or metallic layer is conductive and forms an oxygen diffusion barrier.

In the fabrication of a ferroelectric capacitor, the ferroelectric film 11 is sandwiched between a top electrode 12 and a bottom electrode stack 10. In general the bottom electrode stack fulfills several requirements. The parts of the bottom electrode exposed to the oxygen ambient are preferably stable in oxygen at high temperature or form a conductive oxide after exposure of the electrode material to an oxygen ambient. Suitable materials include noble metals such as platinum and conductive electrode materials such as IrO$_2$ and RuO$_2$. In this manner, the bottom and top electrode layers remain conductive and an electrical signal can be conveyed to the ferroelectric film in order to program the memory cell.

In stacked ferroelectric memory cells, the ferroelectric capacitor 9 is preferably placed on top of a contact 8 in order to conserve area. The contact can be formed from a stack of layers. These layers, however, are not considered part of the bottom electrode stack 10 of the capacitor structure itself, as these contact layers 8 are used for contacts on the chip and to contact the bottom electrode stack 10. The contact 8 connects the memory capacitor 9 with the selection transistor 2. The contact 8 comprises, for example, a plug fill material 81 such as tungsten or polysilicon, and can further comprise an adhesion layer 82 on top of the plug fill material 81. This adhesion layer 82 can furthermore prevent interaction of material of the bottom electrode stack 10 with contact material 81, e.g., prevent the formation of a silicide due to the interaction of Ir from the bottom electrode with Si of the plug fill material 81. This adhesion layer consists of, e.g., nitrides of Ti, Ta, Al, or alloys thereof. The transistor 2 and the contact 8 are commercially available on chips. It is desirable that the characteristics of these elements as used in the "digital" or "logic" circuitry on a chip are not influenced by the formation of the memory cells in subsequent processing.

The bottom electrode stack 10 is conductive when exposed to a high temperature oxygen containing ambient. The bottom electrode stack 10 forms a barrier to diffusion of oxygen from the oxygen containing ambient towards the underlying layers, such as the contact 8, in order to avoid oxidation of the materials used to form the contact as a non-conductive layer would then be formed. The bottom electrode stack 10 does not react, e.g. oxidize, the underlying layers, such as the layers of the contact 8.

Because of these additional requirements, multiple layers, each from a different material, are used to constitute the bottom electrode in conventional methods. Namely, the well-studied Pt electrode (which does not oxidize under typical process conditions) cannot be used alone because of its insufficient oxygen barrier properties. In contrast, it is known that $IrO_2$ on top of TiN results in the formation of a $TiO_2$ interfacial layer. On the other hand, metal oxide films such as $IrO2$ and $RuO_2$, which have good oxygen diffusion barrier properties, act as powerful oxidizers when in contact with a plug or with an adhesion material like TiN. Hence, the addition of a metallic Ir or Ru layer underneath the $IrO_2$ or $RuO_2$ layer to separate the $IrO_2$ or $RuO_2$ layer from the contact material 8 is required in conventional methods. Moreover, the use of layers comprising solely Ir or Ru, which are believed to be good oxygen barrier layers, is not attempted in conventional methods because such layers oxidize in an uncontrolled way during the processing in oxygen of the ferroelectric layer deposited on top of them.

Figure 3:
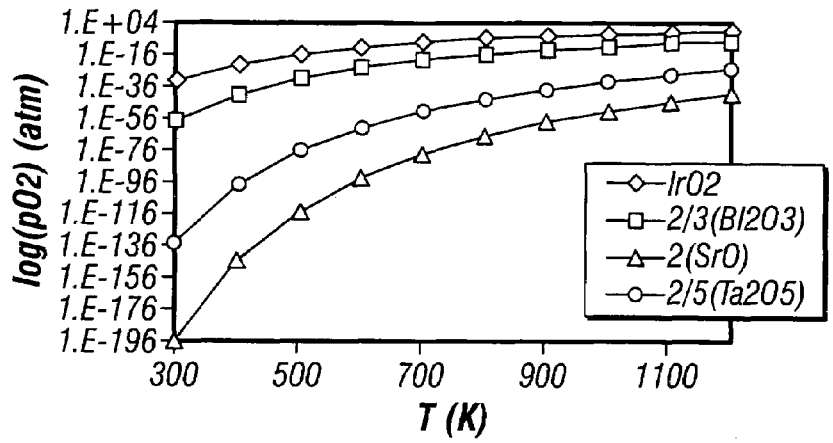
FIG. 3 provides a Log(pO$_2$)-T diagram for the different metal/metal in an SBT/Ir system.

In the method of preferred embodiments, the total pressure in the process chamber is set so as to prevent evaporation of metal or metal oxide compounds from the ferroelectric film. For example, in a two-step process, a fixed total pressure of about 1 atm can be employed. During the second step of the two-step process, i.e., the annealing step, the partial oxygen pressure (pO2) range is selected as a function of the annealing temperature such that the electrode metal (e.g., Ir or Ru) is not oxidized, thus defining the upper bound of the selected range, and such that the metal compounds constituting the ferroelectric layer do not undergo any chemical reduction, thus defining the lower bound of the selected range of the oxygen partial pressure. The method is also applicable for a one-step process wherein deposition of the ferroelectric film and crystallization of this film occurs simultaneously because of the higher deposition temperature and the presence of the oxygen in the process chamber. FIG. 3 provides an oxide stability curve (or metal oxide decomposition curve) as a function of oxygen partial pressure and temperature for a representative system wherein the bottom electrode is Ir and the ferroelectric material is $SrBi_2Ta_2O_9$ (SBT). The y-axis corresponds to log ($pO_2$) (atm) and the x-axis corresponds to temperature (T, in Kelvin). The upper and lower bounds of the oxygen partial pressure range for a given temperature range are identified in FIG. 3 by the process window.

The oxidation of a metal electrode is a function not only of the oxygen partial pressure, but also of the processing temperature and the reduction potential of the metal electrode. The higher the metal reduction potential is, the higher the minimum temperature at which the metal electrode oxidizes. Generally, annealing temperatures from about 400° C. or lower to about 800° C. or higher are preferred.

For a given metal, it is possible to determine from thermodynamic calculations a good estimate of the oxygen partial pressures as a function of temperature above which a metal oxide is stable and below which the reduced metal form is stable. These calculations can be based on Richardson-Ellingham diagrams that show the relative stability versus temperature for different metal oxides at 1 atm total pressure. See, e.g., "Thermodynamics in Material Science," R. T. De Hoff, McGraw Hill, Inc, 1993. These data can be recalculated into an oxide stability curve (or metal oxide decomposition curve) in an oxygen partial pressure versus temperature diagram. FIG. 3 provides such a diagram for the specific case wherein the bottom electrode is Ir and the ferroelectric material is $SrBi_2Ta_2O_9$ (SBT). FIG. 3 provides stability curves as a function of log ($pO_2$) (atm) over a temperature range of from 300 to 1200 K. The stability curve for $IrO_2$ (represented by the line with diamonds) begins at about $4 \times e^{-33}$ at 300K and increases to about $1.4 \times e^1$ at 1200K. The stability curve for $2/3(Bi_2O_3)$ (represented by the line with squares) begins at about $2 \times e^{-58}$ at 300K and increases to about $1 \times e^{-8}$ at 1200K. The stability curve for 2(SrO) (represented by the line with triangles) begins at about $1.4 \times e^{-196}$ at 300K and increases to about $7 \times e^{-42}$ at 1200K. The stability curve for $2/5(Ta_2O_5)$ (represented by the line with x's) begins at about $8 \times e^{-34}$ at 300K and increases to about $7 \times e^{-27}$ at 1200K. Although some approximations are made in the calculation of such curves, it is observed that $IrO_2$ is less stable than any of the metal oxides forming the complex SBT oxide, as shown by the stability curve of $Ir/IrO_2$ in FIG. 3, which lies above all the others. $Bi_2O_3$ is the least stable oxide constituting the complex SBT oxide, as shown by the stability curve of $Bi/Bi_2O_3$ in FIG. 3 which lies above the ones for $Ta/Ta_2O_5$ and Sr/SrO. The data displayed in FIG. 3 is provided in tabular form in the following Table 1.

TABLE 1

| | pO2 = (EXP(ln(pO2)) | | | |
|---|---|---|---|---|
| T (K) | $IrO_2$ | $2/3(Bi_2O_3)$ | 2(SrO) | $2/5(Ta_2O_5)$ |
| 300.00 | 4.12E-33 | 2.28E-58 | 1.42E-196 | 8.38E-134 |
| 400.00 | 1.34E-22 | 8.29E-42 | 5.20E-145 | 3.71E-98 |
| 500.00 | 2.72E-16 | 7.16E-32 | 4.50E-114 | 9.05E-77 |
| 600.00 | 4.36E-12 | 3.02E-25 | 1.90E-93 | 1.64E-62 |
| 700.00 | 4.39E-09 | 1.63E-20 | 1.03E-78 | 2.51E-52 |
| 800.00 | 7.86E-07 | 5.75E-17 | 1.15E-67 | 1.09E-44 |
| 900.00 | 4.44E-05 | 3.31E-14 | 4.51E-59 | 9.52E-39 |
| 1000.00 | 1.12E-03 | 5.35E-12 | 3.38E-52 | 5.39E-34 |
| 1100.00 | 1.57E-02 | 3.43E-10 | 1.43E-46 | 4.17E-30 |
| 1200.00 | 1.42E-01 | 1.10E-08 | 6.95E-42 | 7.26E-27 |

Figure 4A:
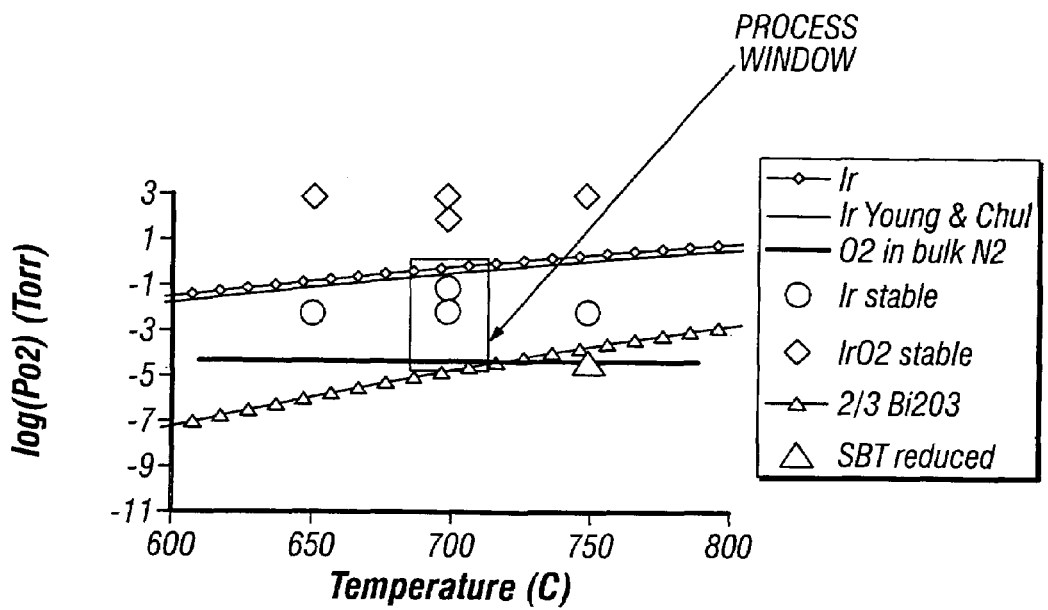
FIG. 4a provides stability curves for Ir and Bi, with experimental data points for Ir, IrO$_2$, and SBT stability.

Focusing only on the curves for $Ir/IrO1_2$ and $Bi/Bi_2O_3$ in FIG. 3, and based on improved approximations (see, e.g., CRC, 77. sup.th edition, CRC press; S. Yong Cha and H. Chul Lee, Jpn. J. Appl. Phys, Vol. 38 (1999), page 1128), the relevant curves are recalculated in FIG. 4a. The y-axis corresponds to log ($pO_2$) (torr) and the x-axis corresponds to temperature (T, in degrees Celsius). The stability curve for Ir (represented by the line with small diamonds) is a straight line beginning at about −1.5 at 600° C. and increasing to about 1 at 800° C. The stability curve for $2/3(BiO_2)$ (represented by the line with small triangles) is a straight line beginning at about log ($pO_2$) (torr) −7 at 600° C. and increasing to about −3.5 at 800° C. The partial pressure of $O_2$ as log ($pO_2$) (torr) in bulk $N_2$ (represented by the heavy solid line) is a level straight line at about −4.5 from 600° C. and to 800° C. Specific temperatures and partial pressures of $O_2$ at which $IrO_2$ is stable include a log ($pO_2$) (torr) of 3 at 650° C., 700° C., and 750° C., and a log ($pO_2$)(torr) of 2 at 700° C. (all identified by large diamonds). Specific temperatures and partial pressures of $O_2$ at which Ir is stable include a log ($pO_2$) (torr) of −2 at 650° C., 700° C., and 750° C., and a log ($pO_2$) (torr) of −1.5 at 700° C. (all identified by large circles). A specific temperature and partial pressure of $O_2$ at which SBT is reduced is log ($pO_2$)(torr) −4.5 at 750° C. (identified by a large gray triangle). The Ir stability curve as calculated by Yong & Chul is depicted as the straight dotted line beginning at about log ($pO_2$)(torr) −1.75 at 600° C. and ending at about log ($pO_2$) (torr) 0.5 at 800° C. See S. Yong Cha, H. Chul Lee, Japanese Journal of Applied Physics, vol. 38, 1999, p 1128. In FIG. 4a at 700° C. which is the temperature conventionally used for the crystallization of SBT films, there is a working window for $pO_2$ wherein both Ir and $Bi_2O_3$ are stable. This window consists of the partial pressures of oxygen below the $Ir/IrO_2$ (curve) and above the $Bi/Bi_2O_3$ curve.

Figure 4B:
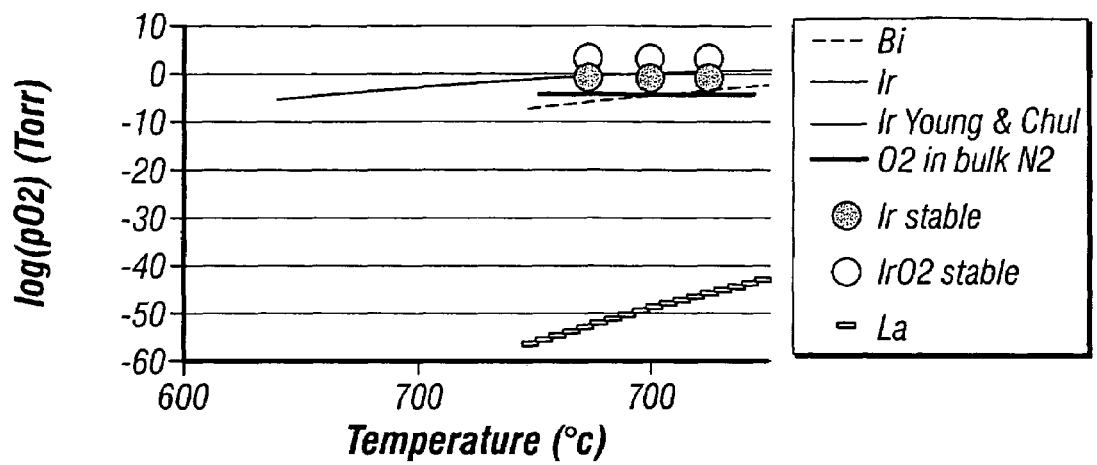
FIG. 4b provides stability curves for Ir, Bi, La, with experimental data points for Ir, IrO$_2$, and LBT stability.

FIG. 4b provides stability curves for Ir, Bi, and La, with experimental data points for Ir, $IrO_2$, and LBT stability. The y-axis corresponds to log ($pO_2$) (torr) and the x-axis corresponds to temperature (T, in degrees Celsius). The stability curve for Ir (represented by the heavy black curve) begins at about log ($pO_2$) (torr) –5 at 375° C. and increases to about log ($pO_2$) (torr) 0 at 800° C. The stability curve for Bi (represented by the heavy gray curve) La (represented by the heavy light gray curve) begins at about log ($pO_2$) (torr) –57 at 600° C. and increases to about log ($pO_2$) (torr) –43 at 800° C. The partial pressure of $O_2$ in bulk $N_2$ (represented by the level heavy solid line) is a level straight line at about log ($pO_2$) (torr) –4.5 from above 600° C. to below 800° C. Specific temperatures and partial pressures of $O_2$ at which $IrO_2$ is stable include a log ($pO_2$) (torr) of 3 at 650° C., 700° C., and 750° C., and a log ($pO_2$) (torr) of 2 at 700° C. (all identified by light gray circles). Specific temperatures and partial pressures of $O_2$ at which Ir is stable include a log ($pO_2$) (torr) of –2 at 650° C., 700° C., and 750° C., and a log ($pO_2$) (torr) of –1.5 at 700° C. (all identified by gray circles). The Ir stability curve as calculated by Yong & Chul is depicted as a dotted line overlapping the Ir curve depicted by the heavy gray curve. As the stability curve for La is below the stability curve of Bi, Bi is more likely then La to form a metal oxide. For the LBT/Ir system, the process window is determined by stability curves of Ir and Bi.

Figure 5:
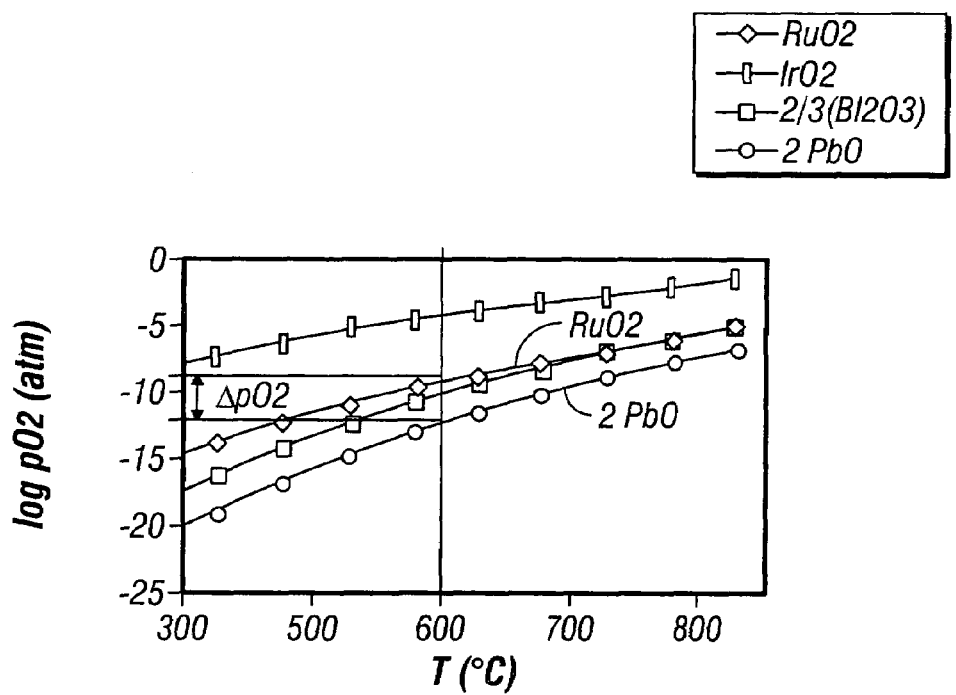
FIG. 5 provides a Log(pO$_2$)-T diagram for the different metal/metal oxide elements in a PZT/Ru system.

FIG. 5 provides such a diagram for the specific case wherein the bottom electrode is Ru and the ferroelectric material is $Pb(Zr,Ti)O_3$ (PZT). The y-axis corresponds to log ($pO_2$) (atm) and the x-axis corresponds to temperature (T, in degrees Celsius). FIG. 5 provides stability curves as a function of log ($pO_2$) (atm) over a temperature range of from 400° C. to 850° C. The stability curve for $RuO_2$ (represented by the line with diamonds) begins at about –15 at 400° C. and increases to about –5 at 850° C. The stability curve for $2/3(Bi_2O_3)$ (represented by the line with squares) begins at about –17 at 400° C. and increases to about –6 at 850° C. The stability curve for 2(PbO) (represented by the line with circles) begins at about –20 at 400° C. and increases to about –7 at 850° C. For comparison purposes, the stability curve for $IrO_2$ (represented by the line with hollow rectangles) begins at about –8 at 400° C. and increases to about –2 at 850° C. As illustrated in FIG. 5, the preferred process window is one wherein partial pressure of oxygen is preferably from about –12.5 to about –9 $\Delta pO_2$, more preferably from about –12 or –11 to about –10 or –9. Temperature is preferably from about 400° C. to about 600° C., more preferably from about 425, 450, 475, or 500° C. to about 525, 550, or 575° C. However, in certain embodiments, partial pressures of oxygen below –12.5 or above –9, and/or temperatures below about 400° C. or above about 600° C. may be preferred. Most preferred is the process window wherein partial pressure of oxygen is from about –12.5 to about –9 and the temperature is from about 400° C. to about 600° C.

It is generally preferred that the $pO_2$ pressure range is above the $pO^2$ present in bulk (i.e., so-called pure) $N_2$, as used in a typical semiconductor fabrication. If the process window requires a partial oxygen pressure below this practical limit, then industrial processing might be difficult. FIG. 5 provides stability curves for Ru, Pb as used in a PZT/Ru system. In this case, the process window is below the $pO_2$ present in bulk (i.e., so-called pure) $N_2$. FIG. 5 provides such a diagram for the specific case wherein the bottom electrode is Ru and the ferroelectric material is $Pb(Zr,Ti)O_3$ (PZT). In this case, other gases are used or added to obtain such a low partial pressure of oxygen. Examples of such gasses include reducing gasses, such as CO, as will be appreciated by a person skilled in the art. A process window for a PZT/Ru system typically includes an oxygen partial pressure range of log ($pO_2$) from about –1.5 to about –3. A process window for an SBT/Ir system typically includes a temperature range from about 650° C. to about 750° C. At a process temperature $T_A pO_2$, the oxygen partial pressure range $\Delta pO_2$ of log($pO_2$) is typically from about –9 to about –12.

Several experiments were performed to define such a working oxygen partial pressure window. The following conditions and materials were employed in the experiments: an SBT ferroelectric layer, an Ir bottom electrode layer, an $Ir/TiO_2$ or Ir/TiN bottom electrode-adhesion structure, a crystallization temperature of 650° and 750° C., and an oxygen partial pressure during crystallization of 100% $O_2$, 10% $O_2$ in $N_2$ (prepared by mixing $O_2$ and $N_2$ gas), 100 ppm $O_2$ in $N_2$ (using a premixed gas mixture), 10 ppm $O_2$ in $N_2$ using 10% of a 100 ppm $O_2$ in $N_2$ gas mixture in 90% $N_2$, and 100% $N_2$ (flow limited by the oxygen content of bulk $N_2$ to approximately 0.07 ppm $O_2$).

Simple $Ir/TiO_2$ or Ir/TiN stacks were annealed at a temperature between 650 and 750° C. with different oxygen partial pressures. Note that the $Ir/TiO_2$ stack is the product of the formation of an Ir layer on an already formed $TiO_2$ bottom electrode layer. This $TiO_2$ bottom electrode layer is not the product of the oxidation of a Ti layer during the formation of a PZT layer.

Figure 6:
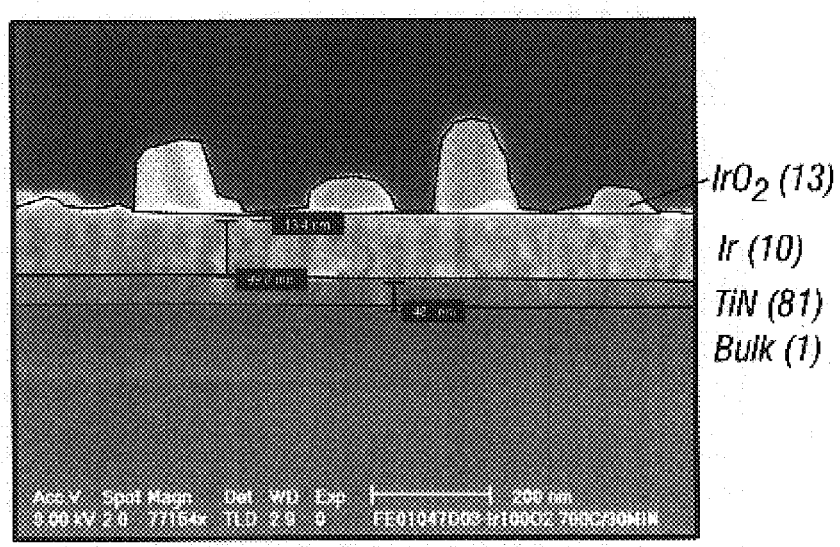
FIG. 6 provides a cross-sectional SEM image of an Ir/TiN sample annealed at 700° C., 30 min in 100% O$_2$. Lines delineating the different layers have been added to the micrograph.
Figure 7:
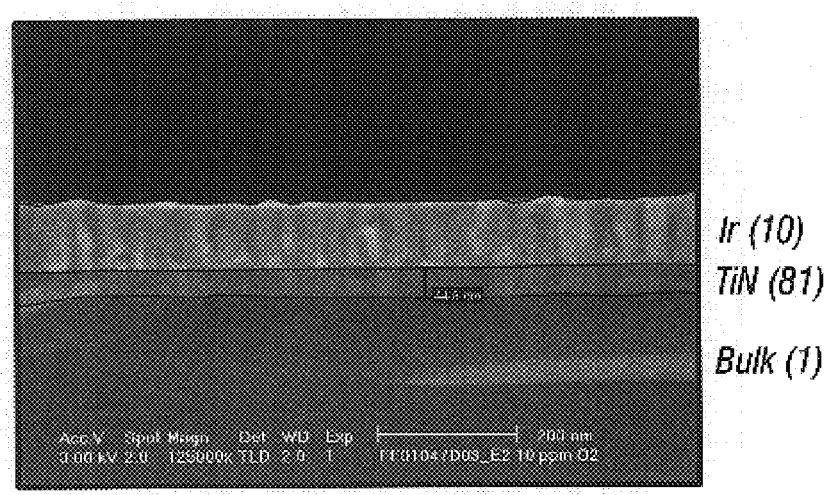
FIG. 7 provides a cross-sectional SEM image of an Ir/TiN sample annealed at 700° C., 30 min in 10 ppm O$_2$ in N$_2$. Lines delineating the different layers have been added to the micrograph.

Experimental data points indicating the presence of Ir or $IrO_2$ are reported in FIG. 4a. The stability of $IrO_2$ at 10% $O_2$ is confirmed at all of the reported temperatures by Auger spectroscopy. Scanning electron microscopy (SEM) investigations on Ir(10)/TiN(81)/bulk(1) stacks annealed in 100% $O_2$ at 700° C. revealed large non-uniform $IrO_2$(13) grains, as depicted in FIG. 6. FIG. 7 shows that formation of $IrO_2$ grains is not observed when Ir(10)/TiN(81)/bulk(1) is annealed at the same temperature in 10 ppm $O_2$. Similar results are observed for annealing at 100 ppm $O_2$. An optimal window of temperature and partial pressure of $O_2$ ($pO_2$) for Ir may be determined from the data. Assuming an ambient pressure of 760 torr (1 atm), a PO2 exceeding that of a bulk $N_2$ gas (containing approximately 0.07 ppm $O_2$) is preferred. However, in certain embodiments, a nonzero partial pressure of oxygen less than that observed in a bulk $N_2$ gas as described above may be acceptable. The $pO_2$ is preferably within the range at which Ir is stable, but less than the $pO_2$ at which $IrO_2$ is stable, at the specified temperature. A process window for an SBT/Ir system preferably includes a temperature of from about 600° C. to about 800° C., more preferably from about 625° C. or 650° C. to about 750° C. or 775° C., and most preferably from about 650° C. or 675° C. to about 700° C., 725° C., or 750° C However, in certain embodiments a process window including a temperature of below about 600° C. or above about 800° C. may be preferred. A process window for an SBT/Ir system preferably includes an oxygen partial pressure, in units of log (pO2) (torr), of from about –1.5 to about –3, more preferably from about –1.75 or –2 to about –2.75 or –3, and most preferably about –2.5. However, in certain embodiments a log($pO_2$) (torr) of greater than about –1.5 or less than about –3 may be preferred. A particularly preferred process window for an SBT/Ir system includes a temperature from about 650° C. to about 750° C., and an oxygen partial pressure, in log ($pO_2$) (torr) of from about –1 and about –3.5. Even more particularly preferred process conditions for Ir include a temperature of between about 667° C. and 717° C., a total pressure of about 760 torr, and a partial pressure of oxygen in log ($pO_2$), of from about –4.5 to about 0 (as depicted by the square box labeled "Process window" in FIG. 1a). If it is preferred to conduct the process at a temperature of less than about 667° C. or at temperature greater than about 717° C., the partial pressure of oxygen may be adjusted up or down accordingly so as to remain at a nonzero value below the Ir stability limit (depicted by the smaller diamonds in FIG. 4a) at that temperature. Preferred combinations of partial pressure of oxygen and temperature may also be determined for Ru using the same methodology once the stability limit is determined. The preferred combination will depend upon the particular metal selected.

Figure 8:
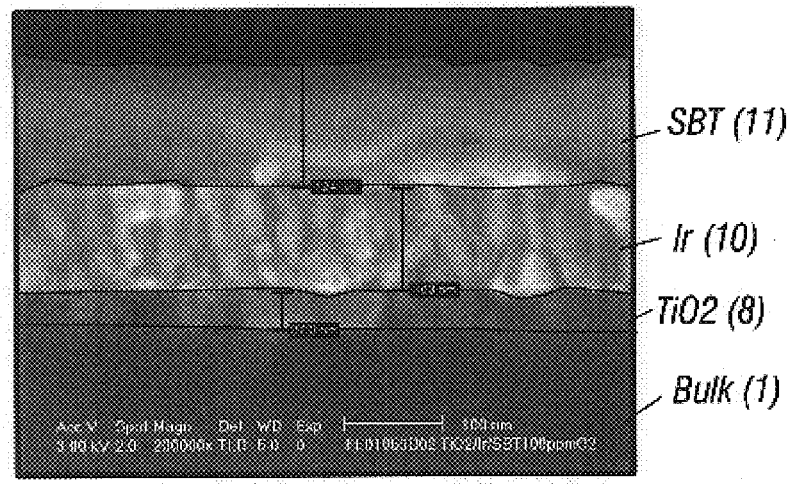
FIG. 8 provides a cross-sectional SEM image of two SBT/Ir/TiO$_2$ samples annealed at 700° C., 30 min in 100 ppm O$_2$ in N$_2$. Lines delineating the different layers have been added to the micrograph.

An SBT layer 11 was deposited on top of the bottom electrode stack. An SBT(11)/Ir(10)/TiO$_2$(82)/bulk(1) sample annealed in 1 atm O$_2$ shows a substantial amount of interfacial IrO$_2$ (13) to be formed. In contrast, for anneals at 10–100 ppm O$_2$, a substantially oxide free SBT(11)/Ir(10) interface is maintained, as shown in FIG. 8. From these results, it can be concluded that the presence of an SBT layer does not prohibit the oxidation of the Ir electrode and that the low pO$_2$ is responsible for the formation of a controlled SBT/Ir structure. For the SBT/Ir samples, no optically visible change in the SBT material occurred for anneals in the different pO$_2$ ambients, except for the anneal at 750° C. in a 100% N$_2$ flow (the triangle in FIG. 4a). At the latter condition, a gray metallic shine appeared at the surface of the structure. As expected from thermodynamical calculations, the Bi$_2$O$_3$ layer is expected to be reduced, and, because of the high temperature, the Bi is expected to melt. From merely theoretical calculations, it is impossible to determine the exact position of the metal oxide stability curves shown in FIGS. 4a and 4b. A partially reduced form of Bi$_2$O$_3$, e.g. BiO, may form at oxygen partial pressures at which Bi$_2$O$_3$ is predicted by theoretical calculations to be stable. The existence of intermediate phases, such as fluorite or pyrochlore, is well known and they may influence the nucleation mechanism. In view of these considerations, the lower bound for pO$_2$ is preferably controlled in such a way as to prevent reduction of the metal constituting the ferroelectric material.

The above-described method may be employed to fabricate ferroelectric capacitors of the type Ir/SBT/Ir with hysteresis characteristics comparable to those of a Pt/SBT/Pt ferroelectric capacitor. Annealing ferroelectric films has been proposed to improve the film morphology, structure, or texture. See Fujimori et al., "Low-temperature crystallization of sol-gel-derived Pb(Zr,Ti)O$_3$ thin films" in the Japanese Journal of Applied Physics Vol 38, 1999, p 5346–5349, where a reduced partial oxygen pressure is used to promote outgassing of the solvents used during spin coating of the sol-gel. In other publications wherein it has been reported to anneal SBT films at reduced oxygen total pressure with the goal of improving film quality and lowering crystallization temperature, a large loss of Bi element was reported. See Ito, Jpn. J. Appl. Phys., Vol. 35 (1996), pp. 4925–4929; and Ogata et al., Extended Abstracts of the 1997 International Conference on Solid State Devices and Materials, Hamamatsu, 1997, page 40–41.

In contrast, a reduced partial pressure of oxygen and a fixed total pressure in the methods of preferred embodiments is employed to avoid the oxidation of the underlying electrode metal, and ultimately to permit the use of a simplified bottom electrode barrier structure for stacked ferroelectric memory cells.

In a preferred embodiment as described in detail above, wherein Ir is the bottom electrode and SBT is the ferroelectric layer, the following simple stacks can be prepared: SBT/Ir/contact plug; and SBT/Ir/TiN/contact plug. As depicted in the cross-sectional SEMs from investigations of oxygen-annealed Ir/TiN samples formed on a silicon wafer 1 as shown in FIG. 6 and FIG. 7, no oxidation of the TiN(81) layer is observed for anneals at 1 atm total pressure and 100% O$_2$ and 10 ppm O$_2$. These results demonstrate that Ir exhibits good oxygen barrier properties. Because of the low oxygen partial pressure employed in the crystallization process described above, layers comprising Ir alone can serve as electrode materials and barrier layers. Often in the formation of ferroelectric stacked memory cells, one or more additional layers, e.g. TiN, are placed between the electrode material and the contact plug in order to improve adhesion or to avoid material interaction.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. All patents, applications, and other references cited herein are hereby incorporated by reference in their entirety.

What is claimed is:

1. A method of fabricating a capacitor, the capacitor comprising a ferroelectric film in contact with a conductive, oxygen diffusion barrier electrode layer, the method comprising the steps of:

forming a conductive, oxygen diffusion barrier electrode layer;

depositing a ferroelectric layer atop the conductive, oxygen diffusion barrier electrode layer; and annealing the ferroelectric layer in an oxygen ambient, wherein a partial pressure of oxygen in the oxygen ambient pO$_2$ is controlled at a level sufficient to oxidize the ferroelectric layer but not at a level sufficient to oxidize the conductive, oxygen diffusion barrier electrode layer, wherein a pO$_2$ is greater than a pO$_2$-Bulk, wherein pO$_2$-Bulk is a partial pressure of oxygen in a bulk N$_2$ gas containing approximately 0.07 ppm O$_2$.

2. The method of claim 1, wherein the conductive, oxygen diffusion barrier electrode layer comprises ruthenium.

3. The method of claim 2, wherein the annealing is conducted at a temperature of from about 400° C. to about 600° C., and wherein a pO$_2$ is from about $1\times10^{-12.5}$ atm to about $1\times10^{-9}$ atm.

4. The method of claim 1, wherein the conductive, oxygen diffusion barrier electrode layer comprises iridium.

5. The method of claim 4, wherein the annealing is conducted at a temperature of from about 600° C. to about 800° C., and wherein a pO$_2$ is from about $1\times10^{-3.5}$ torr to about $1\times10^{-1}$ torr.

6. The method of claim 4, wherein the annealing is conducted at a temperature of from about 667° C. to about 717° C., and a pO$_2$ of from about $1\times10^{-4.5}$ torr to about $1\times10^{0}$ torr.

7. The method of claim 1, wherein the annealing is conducted at a temperature of from about 600° C. to about 800° C.

8. The method of claim 1, wherein the annealing is conducted at a temperature of from about 650° C. to about 750° C.

9. The method of claim 1, wherein the annealing is conducted at a temperature of from about 667° C. to about 717° C.

10. The method of claim 1, wherein the annealing is conducted at a temperature of from about 667° C. to about 717° C., and a $pO_2$ of from about $1\times10^{-4.5}$ torr to about $1\times10^{-0}$ torr.

11. The method of claim 1, wherein the step of forming a conductive, oxygen diffusion barrier electrode layer comprises forming a single conductive, oxygen diffusion barrier electrode layer.

12. The method of claim 11, wherein the single conductive, oxygen diffusion barrier electrode layer comprises ruthenium.

13. The method of claim 11, wherein the single conductive, oxygen diffusion barrier electrode layer comprises iridium.

14. The method of claim 1, wherein the capacitor consists of a single conductive, oxygen diffusion barrier electrode layer.

15. The method of claim 14, wherein the single conductive, oxygen diffusion barrier electrode layer comprises ruthenium.

16. The method of claim 14, wherein the single conductive, oxygen diffusion barrier electrode layer comprises iridium.

* * * * *